United States Patent [19]

Kondo et al.

[11] Patent Number: 5,742,615
[45] Date of Patent: Apr. 21, 1998

[54] NON-VOLATILE SEMICONDUCTOR MEMORY

[75] Inventors: Ichiro Kondo; Nobuyuki Tanaka, both of Tokyo, Japan

[73] Assignee: NEC Corporation, Tokyo, Japan

[21] Appl. No.: 667,145

[22] Filed: Jun. 20, 1996

[30] Foreign Application Priority Data

Jun. 20, 1995 [JP] Japan ................................. 7-152894

[51] Int. Cl.⁶ .................................................. G01R 31/28
[52] U.S. Cl. ............................................ 371/21.3; 365/201
[58] Field of Search ............................... 371/21.3, 21.4; 365/185.22, 189.09, 185.33, 185.19, 185.01–185.04, 230, 185.29, 201, 185.09, 185.1, 189.11, 218; 257/315, 218; 357/45, 23.5; 395/183.18

[56] References Cited

U.S. PATENT DOCUMENTS

| 5,109,257 | 4/1992 | Kondo ................................. 357/23.5 |
| 5,521,864 | 5/1996 | Kobayashi et al. ................. 365/185.22 |
| 5,544,117 | 8/1996 | Nakayama et al. ................. 365/185.22 |
| 5,554,868 | 9/1996 | Hayashikoshi et al. ............. 257/315 |
| 5,572,463 | 11/1996 | Akaogi et al. ...................... 365/185.01 |

FOREIGN PATENT DOCUMENTS

| 61-255048 | 11/1986 | Japan . |
| 4-222994 | 8/1992 | Japan . |
| 5-334900 | 12/1993 | Japan . |

*Primary Examiner*—Robert W. Beausoliel, Jr.
*Assistant Examiner*—Nadeem Iqbal
*Attorney, Agent, or Firm*—Foley &Lardner

[57] ABSTRACT

In order to shorten initialization time, a flash type non-volatile semiconductor memory of the invention comprises a line decoder (2) for selecting all of word lines (WL1 to WLm), a word line voltage generator (3) for generating various voltage, a column decoder (4) for selecting or not selecting all of digit lines (DL1 to DLn).

Erase pulse impression process is performed by supplying a positive first word line voltage to all the word lines (WL1 to WLm) selected, and an erase voltage (Vs) to a source line, leaving all the digit line floating. All of memory-cell-transistors (MC11 to MCmn) are erased by infusing hot carriers in their floating gates by way of avalanche breakdown caused between their sources and substrates.

Depression discrimination is performed with a sense amplifier (8) by selecting all digit lines (DL1 to DLn) and supplying all word lines (WL1 to WLm) with a second word line voltage.

11 Claims, 6 Drawing Sheets

NON-VOLATILE SEMICONDUCTOR MEMORY

BACKGROUND OF THE INVENTION

This invention relates to a non-volatile semiconductor memory and particularly to a flash type non-volatile semiconductor memory wherein are arranged a plurality of memory-cell-transistors erasable and able to be marked electrically.

These days, attention is attracted to non-volatile semiconductor memories baptized as flash memories after their collective erasability in a flash, said flash memories having a matrix of memory cells consisting of field effect transistors (hereafter called memory-cell-transistors) marked or erased by changing their threshold voltages electrically.

In the flash type non-volatile semiconductor memories, initialization of whole memory cells are generally performed by drawing electrons out of floating gates of the memory-cell-transistors by way of a tunnel effect of an electric field generated between their sources and control gates by impressing a high voltage to the sources, leaving potential of their control gates at ground level and their drains floating.

In the initialization above described, there may arise a phenomenon called depression, wherein over time the threshold voltages of some memory cell-transistors become too depressed because of the high voltage impression to the sources or, even with an adequate impression, originating in diminutive defects or a diversity of thicknesses of the control gate insulation layers or a divergence of particle sizes of the floating gates, making corresponding digit lines unreadable since the digit lines are left excited through the depressed memory-cell-transistors in on-cell state even when corresponding word lines are shifted to the ground level.

Therefore, a verification process is generally performed after each impression of erase pulse for confirming there is no depressed memory-cell-transistor.

As it takes too much time when each memory-cell-transistor is checked one by one with the same circuit prepared for ordinary data readout, some circuits for a collective readout are developed to detect existence of depressed memory-cell-transistors, whereof an example is disclosed in a Japanese patent application laid open as a Provisional Publication No. 222994/'92.

FIG. 5 shows an example (hereafter called a first prior art) of conventional non-volatile semiconductor memories of the flash type, wherein a collective readout is performed after impression of an erase pulse for detecting existence of depressed memory-cell-transistors.

The non-volatile semiconductor memory of the first prior art has;

a memory cell array 1x wherein a matrix of memory-cell-transistors MC11x to MCmnx are arranged in lines and columns, each of the memory-cell-transistors consisting of a field effect transistor with a floating gate and able to be marked or erased by controlling its threshold voltage electrically, word lines WL1 to WLm, each of the word lines provided corresponding to each line of the memory cell array 1x and connected with control gates of memory-cell-transistors arranged in the line, digit lines DL1 to DLn, each of the digit lines provided corresponding to each column of the memory cell array 1x and connected to drains of memory-cell-transistors arranged in the column, a source line SL connected with all of the memory-cell-transistors MC11x to MCmnx, a source voltage supply 6 for impressing the source line SL with an erase pulse Ve having a time width and a voltage height predetermined when an erase pulse impression process is performed according to an erase control signal ER and otherwise maintaining potential of the source line SL at a grand level, a word line voltage generator 3x for generating voltages supplied to the word lines WL1 to WLm according to operation modes controlled by a voltage select signal VRS, a line decoder 2x, supplied with control signals ARS and ARN, a line address signal ADr and outputs of the word line voltage generator, for selecting and setting (1) one of the word lines WL1 to WLm at a selected level of ordinary power supply voltage Vcc when an ordinary readout is performed, (2) one of the word lines WL1 to VLm at a writing level of a voltage higher than the power supply voltage Vcc when a data write is performed, and (3) all of the word lines WL1 to WLm at the ground level when an erase pulse is impressed or a depression verification is performed, a column decoder 4 and a column selector 5, supplied with control signals ACS and ACN and a column address signal ADc, for selecting (1) one of the digit lines DL1 to DLn when an ordinary readout or an ordinary data write is performed, (2) all of the digit lines DL1 to DLn when a depression verification is performed and (3) for leaving all of the digit lines un-selected, that is, in a floating state when an erase pulse is impressed, a sense amplifier 8 for detecting and discriminating current level of the digit line or lines selected by the column decoder 4 and the column selector 5 when an ordinary readout or a depression verification is performed, a write voltage supply 7x for supplying the digit line selected by the column decoder 4 with a predetermined data write voltage when a data write is performed, and a selector 9 for selecting the write voltage supply 7x when a data write is performed and otherwise the sense amplifier 8 for connecting to the selected digit line or lines.

Here, in the non-volatile semiconductor memory of the first prior art;

the line decoder 2x comprises line address units, each of which is composed of an inverter IV21 and NAND gates G21 and G22 corresponding to each bit of the line address signal ADr, and word line units, each of which composed of a NAND gate G23x and transistors Q21 and Q22 corresponding to each of the word lines WL1 to WLm, and, the column decoder 4 comprises, similarly to the line decoder 2x, column address units, each of which is composed of an inverter IV41 and NAND gates G41 and G42 corresponding to each bit of the column address signal ADc, and digit line units, each of which is composed of a NAND gate G43 and an inverter IV42.

Now, operation of the non-volatile semiconductor memory of the first prior are is described mainly concerning to the initialization process.

For the first, an erase pulse Ve having the predetermined width and voltage is supplied to the source line SL on condition that all the word lines WL1 to WLm are at the un-select level, or the ground level, and all the digit lines are un-selected, namely, floating, by shifting both of the control signals ARN and ACN at low level.

As a result, in all the memory-cell-transistors MC11x to MCmnx, electrons are drawn out of the floating gates by way of the tunnel effect of the electric field generated between the sources and the control gates, and threshold voltages of these memory-cell-transistors become low making them erased (erase pulse impression process).

Then, in order to discriminate if there is any depressed memory-cell-transistor, all of the digit lines DL1 to DLn are connected to the sense amplifier 8 through the selector 9, on condition that all the word lines WL1 to WLm are at the ground level and all the digit lines DL1 to DLn are selected, by shifting the control signals ARN and ACS to low level and the control signal ACN to high level.

Thus, all the memory-cell-transistors MC11x to MCmnx with their control gates grounded are connected to the sense amplifier 8 for discriminating their current levels (depression discrimination process).

With the same sensitivity as applied in ordinary readout processes for discriminating current level difference between '0' state, erased, and '1' state, marked, of a memory-cell-transistor corresponding to a bit, the sense amplifier 8 can detect a current level if there is depressed any of the memory-cell-transistors MC11x to MCmnx, and a signal is out-put thereof indicating existence of at least one memory-cell-transistor in depression.

In the conventional non-volatile semiconductor memory, when the existence of a memory-cell-transistor in depression is detected, a data write process is performed for returning the depressed memory-cell-transistor to normal state, and the erase pulse impression process and the depression discrimination process above described are repeated until existence of no depressed memory-cell-transistor is confirmed.

In the data write process performed after a depression is detected (data write process after depression discrimination), a high voltage generated from the word line voltage generator 3x is impressed to all the word lines selected, on condition that all of the word lines are selected and all of the digit lines DL1 to DLn are left un-selected, that is, floating, by shifting the control signal ARS and ACN to low level and the control signal ARN to high level.

Here, since the source line SL is left at the ground level, the high voltage generates an electric field between the control gate and the source of every one of the memory-cell-transistors MC11x to MCmnx. So, electrons are infused in floating gates of the memory-cell-transistors MC11x to MCmnx to turn their threshold voltages to high level, making the memory-cell-transistors MC11x to MCmnx marked.

Following the data write process after depression discrimination, the erase pulse impression process and the depression discrimination process are repeated. When existence of no depressed memory-cell-transistor is confirmed in the depression discrimination process, the initialization process is accomplished, while a sequence of the processes beginning with the data write process after depression discrimination is repeated when existence of any depressed memory-cell-transistor is detected.

Thus, in the non-volatile semiconductor memory of the first prior art, the depression discrimination process and the data write process after depression discrimination being both performed collectively at once for all of the memory-cell-transistors MC11x to MCmnx, the initialization process can be accomplished in a short time.

Generally, a non-volatile semiconductor memory is used combined with other units such as a microprocessor, as a member of a higher rank system. In the system, various source voltages, from 1.8V to 5V, for example, are usually prepared to be supplied to various units, including the non-volatile semiconductor memory as well.

However, as for the data write process or the erase pulse impression process, higher voltages, 10V or 12V for example, than the source voltages above described are needed. And if the higher voltages are regenerated from the source voltages, a large scale circuit on a large area IC tip should be prepared.

Therefore, the higher voltages (hereafter called higher source voltages) are prepared from a power supply separately from the source voltages generated from the ordinary power supply (hereafter called a normal power supply) for supplying to ordinary units.

In the non-volatile semiconductor memory, the higher source voltages are required as a voltage (about 10V in the example) supplied to control gate of a memory-cell-transistor (or to a word line), and a voltage (about 6V in the example) supplied to drains (or to the digit lines) in a data write process, as a voltage (about 1 V higher in the example than the normal selection level) supplied to control gates in a write verifying process, and as a voltage (about 10V in the example) supplied to the sources (or to the source line) in an erasing pulse impression process.

These higher source voltages are generated by a high voltage power supply, examples of which are disclosed in a Japanese patent application laid open as a Provisional Publication No. 255048/'86 and shown in FIG. 6A and FIG. 6B.

The circuit of FIG. 6A comprises;

a resistor R35 with an end connected to a high voltage power supply Vpp, a resistor R36 with an end connected to the other end of the resistor R35 and with the other end connected to the ground, a resistor R37 with an end connected to the high voltage power supply, an n-channel type transistor Q36 with a substrate grounded, a gate and a drain connected to the other end of the resistor R37, and a source connected to connection between the resistors R35, R36, a p-channel type transistor Q37 with a source and a substrate connected to the source of the n-channel type transistor Q36, a resistor R38 with an end connected to the gate and drain (hereafter called a first reference voltage point) of the p-channel type transistor Q37 and the other end connected to the ground, an n-channel type transistor Q38 with a drain connected to the high voltage power supply Vpp, a gate connected to the gate and drain (hereafter called a second reference voltage point) of the n-channel type transistor Q36, a substrate connected to the ground, and a source connected to an output terminal, and a p-channel type transistor Q39 with a source and a substrate connected to the output terminal, a gate connected to the gate and the drain of the p-channel type transistor Q37, and a drain connected to the ground.

In the circuit, threshold voltages of the n-channel type transistors Q36, Q38 and the p-channel type transistors Q37, Q39 are prepared equal with each other, and the resistance of the resistors R37, R38 are prepared sufficiently larger than those of the resistors R35, R36. Thus, there can be obtained an output voltage Vo equal to a divisional voltage between the resistors R35 and R36, and maintained constant against changes of the output current.

The circuit of FIG. 6B has a similar configuration with the circuit of FIG. 6A, whereof the resistors R35 and R36 are eliminated. Although the output voltage Vo of the circuit of FIG. 6B is determined by the resistance of the resistors R37 and R38 and the threshold voltages of the transistors Q36 and Q37, it is set here by adjusting resistance of the resistors R37 and R38, since threshold voltages of the transistors Q36 and Q37 depend on their manufacturing process.

In these circuit, each of voltage differences of the gates of the transistors Q38 and Q39 compared with their sources, their drains and their substrates can remain lower than ½ of the high voltage power supply Vpp when the output voltage Vo is set to Vpp/2, but otherwise, some of them should become higher than Vpp/2. Therefore, high voltage type transistors should be used for the transistors Q38 and Q39.

Further, for the non-volatile semiconductor memory, an inter-bit interference test is indispensable, wherein are written and readout all '0' (all on-cell) data, all '1' (all off-cell) data, or checkered pattern data where every two adjacent memory-cell-transistors have opposite status to each other.

As for data write of these three patterns, the all '0' data can be directly obtained by the initialization, and all '1' data are obtained by impressing collectively a predetermined voltage selecting all the word lines and digit lines. But for the checkered pattern, some contrivance is necessary, since it will take much time if the data are written bit by bit.

So, in a second prior art disclosed in a Japanese patent application laid open as a Provisional Publication No. 334900/'93 (hereafter called a second prior art), every second word line and every second digit line are both controlled to be selected or un-selected by turns.

However, as for readout, data of these three test patterns are all to be readout bit by bit, in the prior art.

As heretofore described, in the non-volatile semiconductor memory of the first prior art, the initialization is performed by drawing electrons out of floating gates of memory-cell-transistors MC11x to MCmnx by way of the tunnel effect.

Therefore, an erase pulse having a predetermined voltage and pulse width is impressed to the source line SL, on condition that all the word lines WL1 to WLm are grounded, at un-selected level, and all the digit lines DL1 to DLn rest floating at un-selected level too. So, generation probability of the over depressed memory-cell-transistor is certainly high, because of the fluctuation of the width of the erase pulse Ve or the thickness of gate insulation layers depending on their manufacturing processes.

For that reason, the erase pulse impression process should be followed by some sequences of the processes; a collective depression discrimination process for all memory-cell-transistors, a collective data write process for all memory-cell-transistors performed when a depressed memory-cell-transistor is detected, and the other erase pulse impression, resulting in a long time necessary for the initialization.

This is a defect. Moreover, there is another problem in the first prior art that high voltage type transistors are required for generating the higher source voltages to be impressed on the word lines and digit lines.

In order to obtain each of these higher source voltages, which are generated from the high voltage power supply Vpp prepared for the purpose in consideration of the uniformity of other units in the system, a serial connection of an n-channel type transistor and a p-channel type transistor is inserted between the high voltage power supply Vpp and the ground, and to gates of these transistors are impressed two reference voltages higher and lower by their threshold voltages respectively than a voltage Vo to be output.

Therefore, when the output voltage Vo is not equal to Vpp/2, some of the voltage differences of the gate compared to the source, the drain, or the substrate of either transistor should become higher than Vpp/2.

This is why these transistors must be high voltage type transistors.

Furthermore, as described in connection with the second prior art, there is still another problem that it takes a long time for an inter-bit interference test to readout and confirm the checkered pattern test data bit by bit, as well as the readout and the confirmation of the all '0' data or the all '1' data, even if data write of the checkered pattern test data is shortened by selecting each second word lines and digit lines by turns.

SUMMARY OF THE INVENTION

Therefore, a primary object of the present invention is to provide a non-volatile semiconductor memory wherein a time needed for completing the initialization is reduced. Another object is to provide a non-volatile semiconductor memory wherein no high voltage type transistor is required for generating higher source voltages from a high voltage power supply. Still another object of the invention is to provide a non-volatile semiconductor memory wherein a total time necessary s for an inter-bit interference test is reduced including readout time of such test pattern data as checkered pattern data.

In order to achieve the object, a non-volatile semiconductor memory of the present invention comprises:

a memory cell array consisting of a matrix of memory-cell-transistors arranged in lines and columns, each of said memory-cell-transistors able to be marked and erased electrically;

word lines, each of said word lines connected to control gates of memory-cell-transistors arranged in each of said lines of said matrix;

digit lines, each of said digit lines connected to drains of memory-cell-transistors arranged in each of said columns of said matrix;

a source line connected to sources of all of said matrix of memory-cell-transistors;

a word line voltage generator for generating word line voltages including a first word line voltage used in an erase pulse impression process and a second word line voltage used in a depression discrimination process;

a line decoder for selecting and supplying all of said word lines with said first word line voltage in said erase pulse impression process and said second word line voltage in said depression discrimination process, and selecting and supplying one of said word lines designated by a line address signal delivered from outside with corresponding word line voltages generated by said word line voltage generator in an ordinary readout process and an ordinary data write process respectively;

a source voltage supply for supplying said source line with an erase pulse of a predetermined voltage in said erase pulse impression process, and otherwise grounding said source line;

a column decoder and a column selector for leaving all of said digit lines floating in said erase pulse impression process, selecting all of said digit lines in said depression discrimination process, and selecting one of said digit lines designated by a column address signal delivered from outside in an ordinary readout process and an ordinary data write process;

a sense amplifier for discriminating a signal level of said all of said digit lines selected in said depression discrimination process and said one of said digit lines selected in said ordinary readout process; and a write voltage supply for supplying said one of said digit lines selected with a predetermined voltage in said ordinary data write process.

And in the non-volatile semiconductor memory of the invention:

each of said memory-cell-transistors consists of a n-channel type field effect transistor having a floating gate, and a substrate granded;

all of said memory-cell-transistors are erased collectively by infusing hot carriers into said floating gates thereof by way of avalanche breakdown caused with said first word line voltage impressed to gates thereof and said erase pulse impressed to sources thereof in said erase pulse impression process; and any of said memory-cell-transistors in depression is detected collectively by discriminating a total current level flowing on all of said digit lines with said second word line voltage supplied to control gates thereof, by said sense amplifier connected to all of said digit lines selected by said column decoder and said column selector, in said depression discrimination process performed after said erase pulse impression process.

Therefore, in the non-volatile semiconductor memory of the invention, threshold voltages of the memory-cell-transistors are to converge to a value determined by the first voltage without any influence of the threshold voltages before the erase, preventing occurrence of the depression. So, if a depression occurs, it can be considered to be caused by some defect in the memory-cell-transistor, and one cycle of erase pulse impression and depression discrimination is sufficient for the initialization, reducing time needed for the initialization.

Further, a non-volatile semiconductor memory of the invention is provided with a memory control voltage supply for generating memory control voltages supplied to said word line voltage generator and said write voltage supply; comprising:

a first and a second resistors serially connected between a high voltage power supply and a grand terminal;

a first n-channel type transistor with a gate connected to a connection between said first and said second resistors and a source connected to one having higher voltage of said high voltage power supply and said grand terminal;

a second n-channel type transistor with a drain connected to a source of said first n-channel type transistor, a source connected to an output terminal for supplying said memory control voltages and a gate delivered with a first n-channel type transistor voltage; and a third n-channel type transistor with a drain connected to the other one having lower voltage of said high voltage power supply and said grand terminal, a source connected to said output terminal and a gate delivered with a second reference voltage.

And another non-volatile semiconductor memory of the invention is provided with a memory control voltage supply for generating memory control voltages supplied to said word line voltage generator and said write voltage supply; comprising:

a first and a second resistors serially connected between a high voltage power supply and a grand terminal;

a first n-channel type transistor with a gate connected to a connection between said first and said second resistors and a drain connected to one having lower voltage of said high voltage power supply and said grand terminal;

a second n-channel type transistor with a drain connected to the other one having a higher voltage of said high voltage power supply and said grand terminal, a sources connected to an output terminal for supplying said memory control voltages therefrom and a gate delivered with a first reference voltage and a third n-channel type transistor with a drain connected to a source of said first n-channel type transistor, a source connected to said output terminal and a gate delivered with a second reference voltage.

Therefore, there is required no high voltage type transistor in the invention.

Furthermore, a non-volatile semiconductor memory of the invention further comprises:

a pull-up circuit for supplying all of said digit lines connected thereto and disconnected from said sense amplifier in an erase check process performed after said erase pulse impression process with a normal power supply voltage through a resistor R10 having a resistance sufficiently higher than resistance of said memory-cell-transistors in on-cell state; and an OR circuit for confirming on-cell states collectively of memory-cell-transistors connected to one of said word lines selected one after one to be supplied with a third word line voltage, by obtaining OR logic of signals of all of said digit lines connected thereto.

Therefore, even all '0' data for an inter-bit interference test can be readout in a short time in the invention.

Still further, in a non-volatile semiconductor memory of the invention:

said line decoder comprises a first even-odd selecting means for selecting either all even numbered or all odd numbered of said word lines;

said column decoder comprises a second even-odd selecting means for selecting either all even numbered or all odd numbered of said digit lines;

an OR gate is further provided for obtaining OR logic of signals of all of said digit lines;

a pull-up circuit is also provided for supplying digit lines selected by said column decoder to be connected thereto with a normal power supply voltage through an resistor R10 having a resistance sufficiently higher than resistance of said memory-cell-transistors in on-cell state;

checkered pattern test data are written by erasing one of every adjacent two in lines and columns of said memory-cell-transistors and marking the other of said every adjacent two by controlling said first and said second even-odd selecting means;

states of memory-cell-transistors marked of said checkered pattern test data are verified collectively with said sense amplifier by detecting a total current level floating on all of said digit lines connected thereto with a word line voltage impressed to all even numbered and all odd numbered of said word lines by turns controlled by said first even-odd selecting means; and states of memory-cell-transistors erased of each line of said checkered pattern test data are checked collectively each by each with said OR circuit obtaining OR logic of signals of all of said digit lines, impressing a word line voltage to a word line corresponding to said each line, connecting said pull-up circuit to a half of said digit lines corresponding to memory-cell-transistors erased of said each line, and granding the other half of said digit lines through resistance.

So, even checkered pattern test data can be written and readout in the invention, remarkably reducing total time needed for the initialization and memory check of flash type non-volatile semiconductor memories.

BRIEF DESCRIPTION OF THE DRAWINGS

The foregoing, further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

Now, embodiments of the present invention will be described in connection with the drawings.

Figure 1:
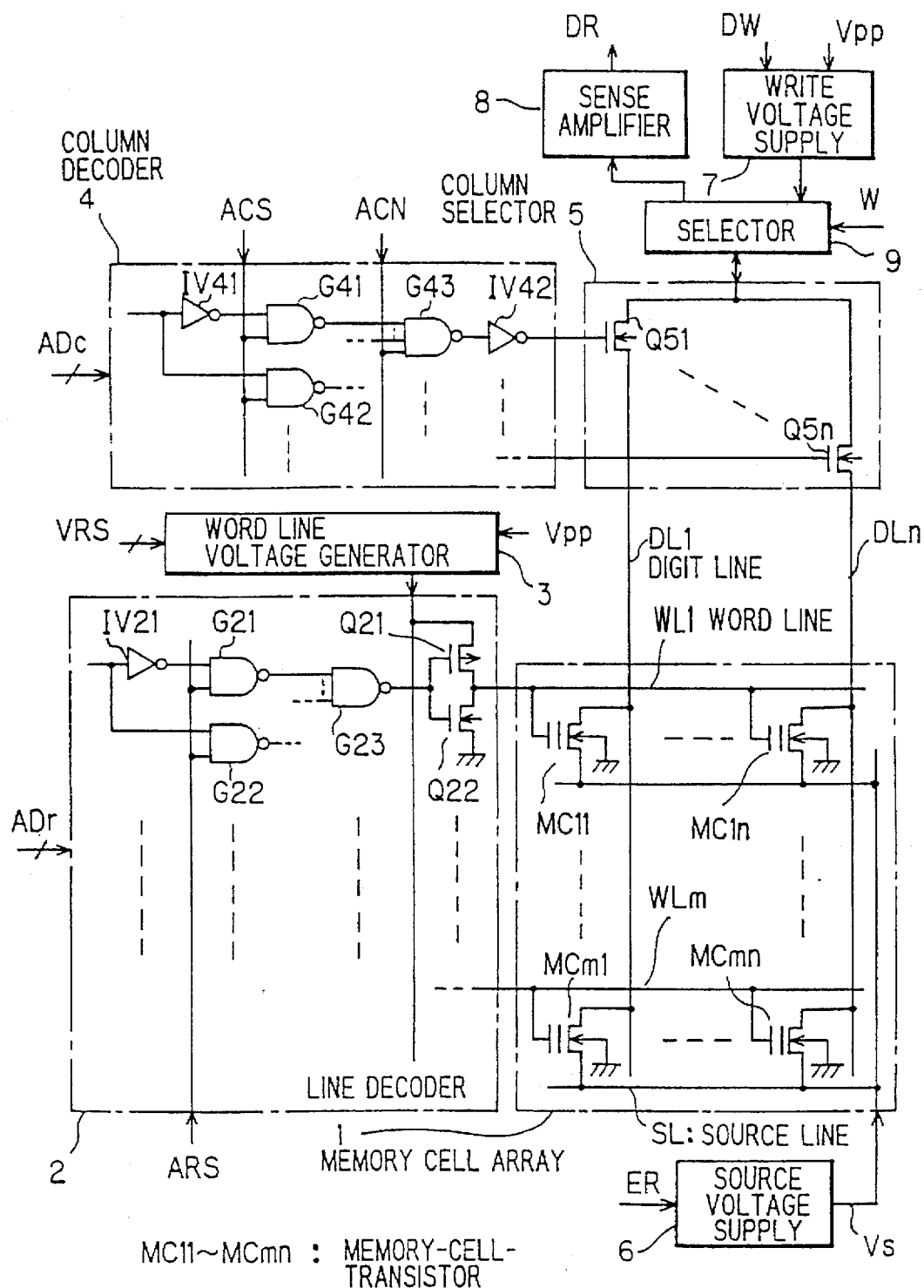
FIG. 1 is a circuit diagram illustrating a first embodiment of a non-volatile semiconductor memory of the invention.

FIG. 1 is a circuit diagram illustrating a first embodiment of a non-volatile semiconductor memory of the invention, comprising;

memory cell array 1 consisting of a matrix of memory-cell-transistors MC11 to MCmn arranged in lines and columns, each of the memory-cell-transistors MC11 to MCmn composed of a field effect transistor with a floating gate and able to be marked or erased by controlling its threshold level electrically, word lines WL1 to WLm, each of the word lines WL1 to WLm provided corresponding to each line of the memory cell array 1 and connected with control gates of memory-cell-transistors arranged in the line, digit lines DL1 to DLn, each of the digit lines DL1 to DLn provided corresponding to each column of the memory cell array 1 and connected with drains of memory-cell-transistors arranged in the column, a source line SL connected with all of the memory-cell-transistors MC11 to MCmn, a word line voltage generator 3 for generating various voltages including a first word line voltage used when a erase pulse is impressed and a second word line voltage used when depression is detected, according to operation modes controlled by a voltage select signal VRS, a line decoder 2, controlled by a control signal ARS and a line address signal ADr, for selecting and supplying all of the word lines WL1 to WLm with the first word line voltage or the second voltage generated by the word line voltage generator when an erase pulse is impressed or a depression verification is performed, and selecting and supplying one of the word lines WL1 to WLm designated by the line address signal ADr with a corresponding voltage generated by the word line voltage generator 3 when an ordinary data write or a readout is performed, a source voltage supply 6 for impressing the source line SL with an erase pulse Vs having a time width and a voltage height predetermined when an erase pulse impressing process is performed according to an erase control signal ER, and otherwise maintaining potential of the source line SL at the ground level, a column decoder 4 and a column selector 5, controlled by control signals ACS and ACN and a column address signal ADc, for selecting one of the digit lines DL1 to DLn when an ordinary readout or an ordinary data write is performed, all of the digit lines DL1 to DLn when a depression verification is performed and for leaving all of the digit lines DL1 to DLn un-selected, that is, in a floating state when an erase pulse is impressed, a sense amplifier 8 for detecting and discriminating current level of the digit line or lines selected by the column decoder 4 and the column selector 5 when an ordinary readout or a depression verification is performed, a write voltage supply 7 for supplying a digit line selected by the column decoder 4 with a predetermined data write voltage when an ordinary data write is performed, and a selector 9 for selecting the write voltage supply 7 when an ordinary data write is performed and otherwise the sense amplifier 8 for connecting to the column selector 5.

Figure 5:
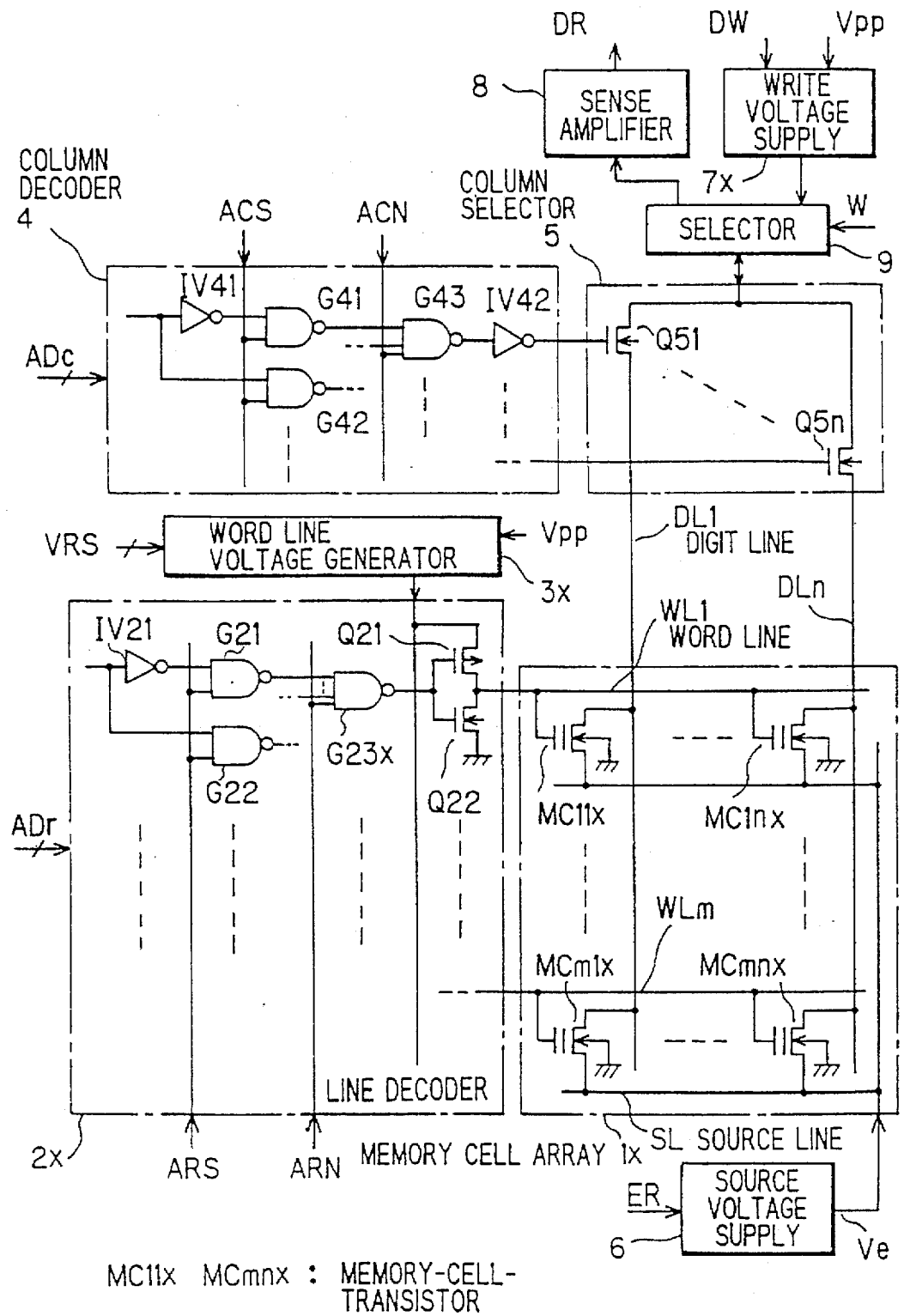
FIG. 5 shows an example of conventional non-volatile semiconductor memories.

Here, in the non-volatile semiconductor memory of the embodiment;

the line decoder 2 comprises line address units, each of which is composed of an inverter IV21 and NAND gates G21 and G22 corresponding to each bit of the line address signal ADr, and word line units, each of which composed of a NAND gate G23 and transistors Q21 and Q22 corresponding to each of the word lines WL1 to WLm, and, contrary to the non-volatile semiconductor memory of the first prior art of FIG. 5, there is no control signal ARN which is prepared to be supplied to the line decoder 2x.

As for the column decoder 4 and the column selector 5, they have the same configurations with those of the non-volatile semiconductor memory of the first prior art of FIG. 5.

Further, in the embodiment, the memory-cell-transistors MC11 to MCmn are composed of n-channel type field effect transistors having floating gates and grounded substrates. In an erase pulse impression process, the control signals ARS and ACN being set at low level, a positive first word voltage (about 1V, for example, when the normal positive supply is 3.3V) is impressed to the control gates of all the memory-cell-transistors MC11 to MCmn through all the word lines WL1 to WLm, and an erase voltage Vs (10V, for example) is impressed to their sources through the source line SL. Thus, all the memory cell transistors MC11 to MCmn are erased here by infusing hot carriers by way of an avalanche breakdown caused between their sources and substrates.

With the erase pulse impression process above described, threshold voltages of the memory-cell-transistors MC11 to MCmn are to converge to a value determined by the first word line voltage without any influence of the threshold voltages before the erase, preventing occurrence of the depression.

So, in the embodiment, if a depression occurs, it can be considered to be caused by some defect in the memory-cell-transistor, and therefore one cycle of erase pulse impression and depression discrimination is sufficient for the initialization.

As for the depression discrimination process, the control signals ARS and ACS being set at low level and the control signal ACN being set at high level, all the word lines WL1 to WLm are selected and supplied with a positive second word line voltage (a voltage slightly lower than the first word line voltage, for example) from the word line voltage generator 3, and all the digit lines DL1 to DLn are selected and connected to the sense amplifier 8 through the selector 9.

Thus, all the memory-cell-transistors MC11 to MCmn are selected and their total current level is detected and discriminated by the sense amplifier 8.

The sensitivity of the sense amplifier 8 remaining at the same sensitivity for discriminating current levels of '1' or '0' of a memory-cell-transistor corresponding to a bit in a normal readout, if there is at least one in depression among the memory-cell-transistors MC11 to MCmn, its current level is detected by the sense amplifier 8 and the depression is discriminated.

Thus, in the embodiment, time needed for completing the initialization can be reduced, since one cycle of erase pulse impression and depression discrimination is sufficiently performed collectively for all the memory-cell-transistors MC11 to MCmn, as beforehand described.

Further, in the embodiment, there is not required any high voltage type transistor for the word line voltage generator 3 or the write voltage supply 7.

Also in the embodiment, the word line voltage generator 3 and the write voltage supply 7 generate the higher source voltages to be supplied to the word lines and the digit lines from the high voltage power supply Vpp in consideration of the uniformity of other units in the system.

Figure 2A:
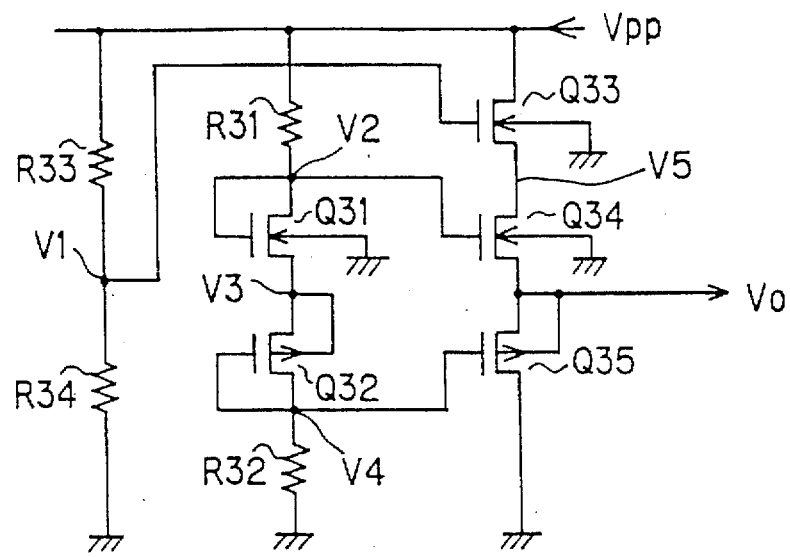
FIG. 2A show an example of the circuit of the embodiment for generating the higher source voltages from the high voltage power supply Vpp.
Figure 2B:
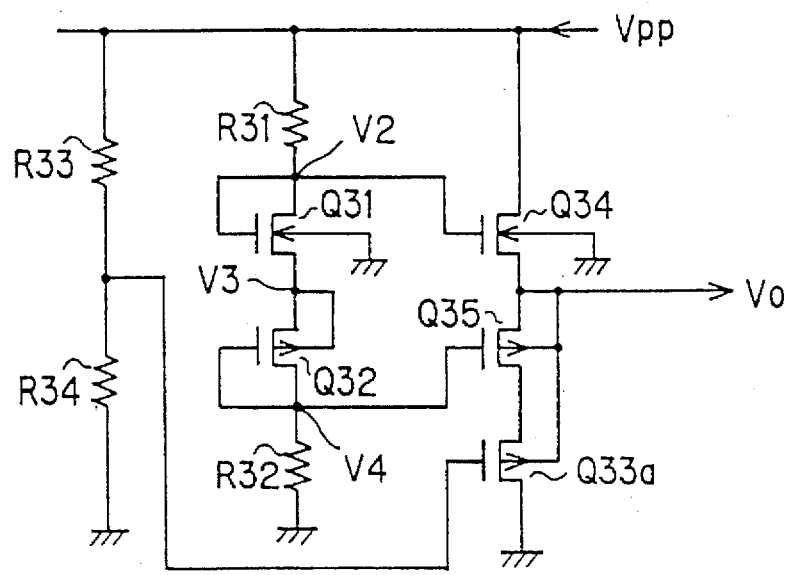
FIG. 2B show another example of the circuit of the embodiment for generating the higher source voltages from the high voltage power supply Vpp.

FIG. 2A and FIG. 2B show examples of the circuit of the embodiment for generating the higher source voltages from the high voltage power supply Vpp.

The circuit shown in FIG. 2A is used for generating voltages lower than a half of the high voltage power supply Vpp, which are used, for example, when a normal power supply voltage (Vcc) is in an order of 3.3V or lower, while the circuit shown in FIG. 2B is used for generating voltages higher than a half of the high voltage power supply Vpp, which are used, for example, to be supplied to the digit lines in data write processes when the normal power supply voltage (Vcc) is in an order of 5V.

The circuit shown in FIG. 2A comprises;

a resistor R31 with an end connected to the high voltage power supply Vpp, an n-channel type transistor Q31 with a gate and a drain connected to the other end of the resistor R31, and a substrate grounded, a p-channel type transistor Q32 with a source and a substrate connected to the source of the n-channel type transistor Q31, a resistor R32 with an end connected to the gate and the drain of the p-channel type transistor Q32, and the other end grounded, a resistor R33 with an end connected to the high voltage power supply Vpp, a resistor R34 with an end connected to the other end of the resistor R33 and the other end grounded, an n-channel type transistor Q33 with a drain connected to the high voltage power supply Vpp, a gate connected to the connection of the resistors R33 and R34, and a substrate grounded, an n-channel type transistor Q34 with a drain connected to a source of the transistor Q33, a gate connected to the gate and the drain (hereafter called a first reference voltage point V2) of the transistor Q31, with a source connected to an output terminal, and a substrate grounded, and a p-channel type transistor Q35 with a source and a substrate connected to the output terminal, a gate connected to the gate and the drain (hereafter called a second reference voltage point V4) of the transistor Q32, and a drain grounded.

Figure 6A:
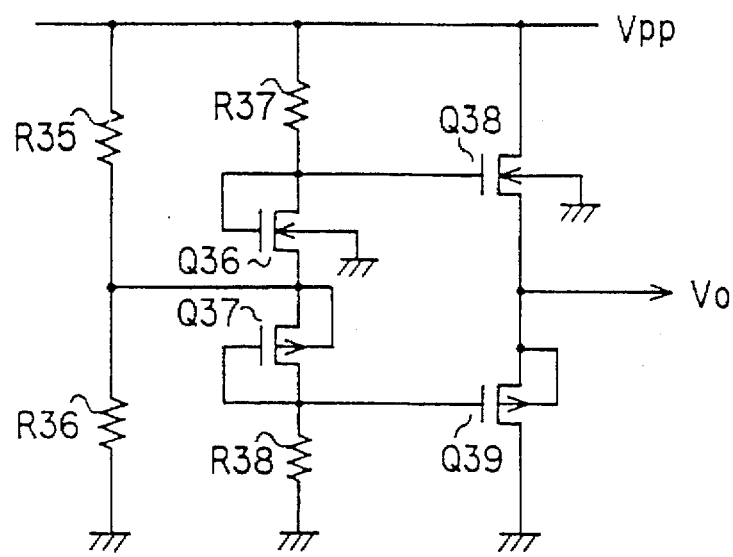
FIG. 6A shows an example of a high voltage power supply of a prior art.
Figure 6B:
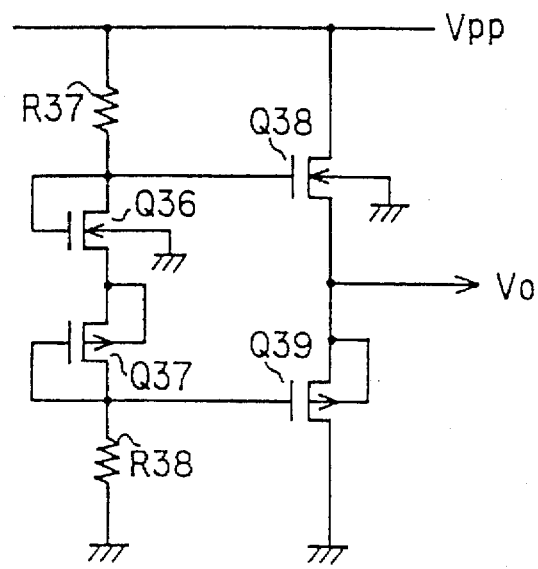
FIG. 6B shows another example of a high voltage power supply of the prior art.

Also in the circuit of FIG. 2A, the output voltage Vo is determined by the resistors R31 and R32 as in the circuit shown in FIG. 6B. And here, voltage (V5) between drains of the transistors Q34 and Q35 can be lowered by the resistors R33 and R34 and the transistor Q33. So, even when the output voltage Vo is nearly 0V, the voltage V5 can be set nearly a half of the high voltage power supply Vpp. Therefore, voltage differences of the gate from the source, the drain, and the substrate (since voltage of the substrate just beneath the gate insulation layer is between the source voltage and the drain voltage since a current is flowing between the source and the drain) can be made less than Vpp/2 in any of the transistors Q33 to Q35.

Thus, there is no need to use any high voltage type transistor.

In the circuit shown in FIG. 2B, a transistor Q33a is inserted between the drain of the transistor Q35 and the ground, in order to lower voltage difference between drains of the transistors Q34 and Q35. In the circuit too, the voltage difference between the drains of the transistors Q34 and Q35 can be set about Vpp/2 by the resistors R33 and R34 and the transistor Q33a even when the output voltage Vo is nearly Vpp.

Thus, the voltage differences of the gate from the source, the drain, and the substrate of any of the transistors Q33a, Q34, and Q35 can be maintained lower than Vpp/2, making unnecessary to use any high voltage transistor.

Figure 3:
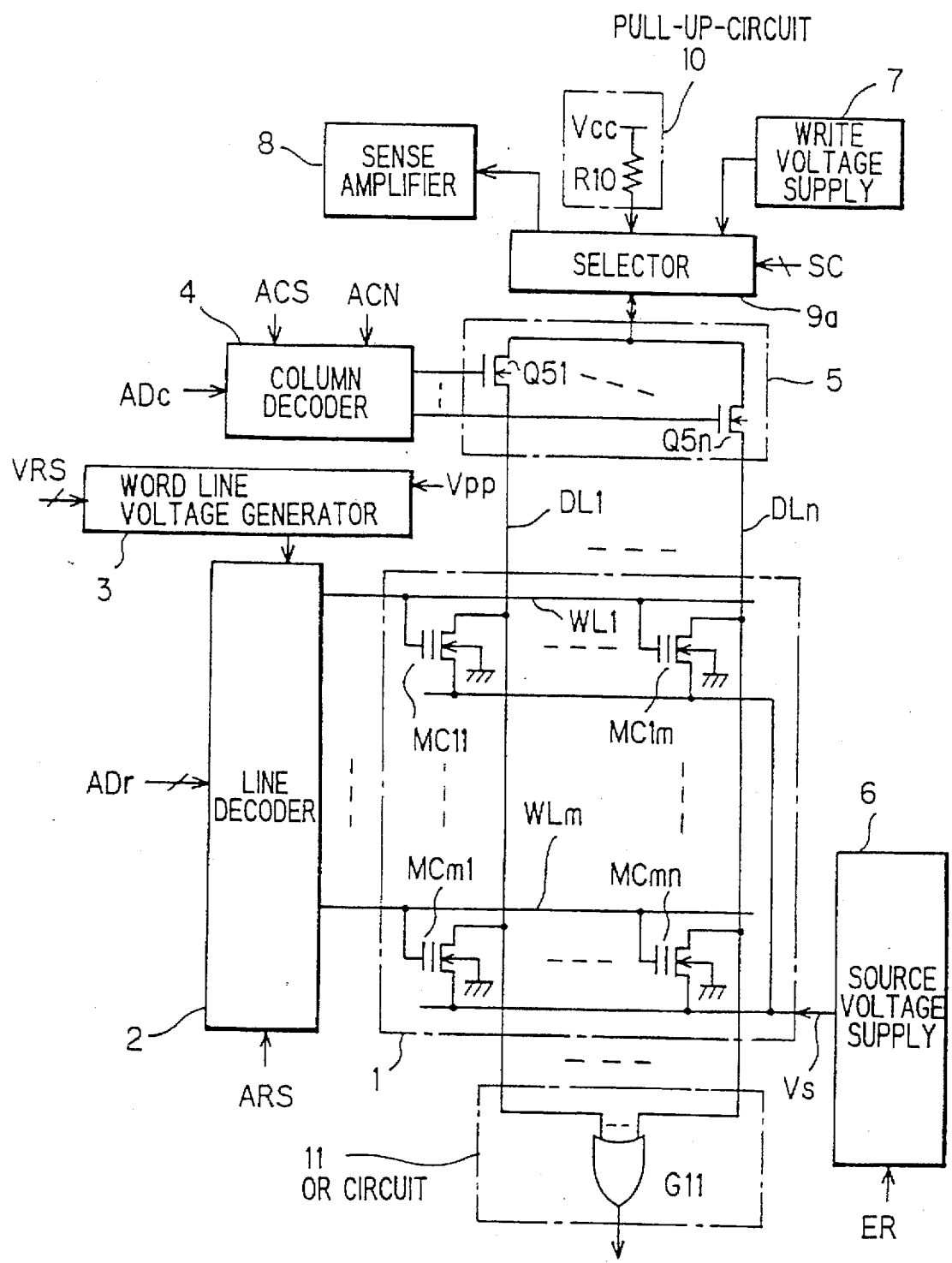
FIG. 3 shows a second embodiment of the invention.

Now, a second embodiment of the invention shown in FIG. 3 is described.

In the second embodiment, different from the first embodiment of FIG. 1, there are provided, a pull-up circuit 10 for pulling-up selected digit lines to the normal power supply voltage Vcc through a resistor R10 having a resistance sufficiently larger than a resistance of a memory-cell-transistor in '0' erased (on-cell) state, an OR gate G11 for obtaining OR logic of signals on all the digit lines DL1 to DLn, and a selector 9a, instead of the selector 9, for connecting the column selector 5 to any one of the write voltage supply 7, the sense amplifier 8, and the pull-up circuit 10 in accordance with operation modes.

Now, operation of the second embodiment will be described mainly concerning to the test data readout.

All '0' data means all the memory-cell-transistors MC11 to MCmn are on-state such as just after initialized.

Readout of the all '0' data is performed by setting the control signals ARS and ACN at high level, and the control signal ACS at low level, in order to select all the digit lines DL1 to DLn for connecting them to the pull-up circuit 10 through the selector 9a. Then, one of the word lines WL1 to WLm is selected according to the line address signal ADr and supplied with an on-cell check voltage from the word line voltage generator 3. (This on-cell check voltage is the same or a slightly lower than the voltage supplied in an ordinary data readout process, Vcc for example.)

Thus, the drains of all the memory-cell-transistors (MC11 to MC1n, for example) connected to the selected word line (the word line WL1) are connected to the input terminals of the OR gate G11 through corresponding digit lines (DL1 to DLn), and all the digit lines (DL1 to DLn) are connected to the pull-up circuit 10. Consequently, if all these memory-cell-transistors (MC11 to MC1n) are normally shifted to '0' (that is, in on-cell state, or erased state), all the digit lines (DL1 to DLn) become at logic LOW, the ground level. So, the output of the OR gate G11 too becomes at logic LOW, indicating that the all '0' data are written and readout normally for these memory-cell-transistors (MC11 to MC1).

When there is any in off-cell state among these memory-cell-transistor (MC11 to MC1n), the corresponding digit line is pulled-up to the normal power supply voltage Vcc through the pull-up circuit 10, so the output of the OR gate G11 become to high level, indicating that there is at least one memory-cell-transistor which can not be normally shifted to '0' to be readout as '0'.

By performing the same process for all the word lines WL1 to WLm line by line, the all '0' data test can be completed for all the memory-cell-transistors MC11 to MCmn.

Therefore, in the embodiment where data readout of memory-cell-transistors connected to a word line is performed collectively, the time needed for the all '0' data test can be certainly reduced compared with the non-volatile semiconductor memory of the first prior art wherein data readout is performed bit by bit.

Further, when a confirmation that all the memory-cell-transistors are normally erased is necessary besides the depression discrimination after the initialization, the confirmation can be also performed in the same way with this all '0' data readout test, in the embodiment.

Figure 4:
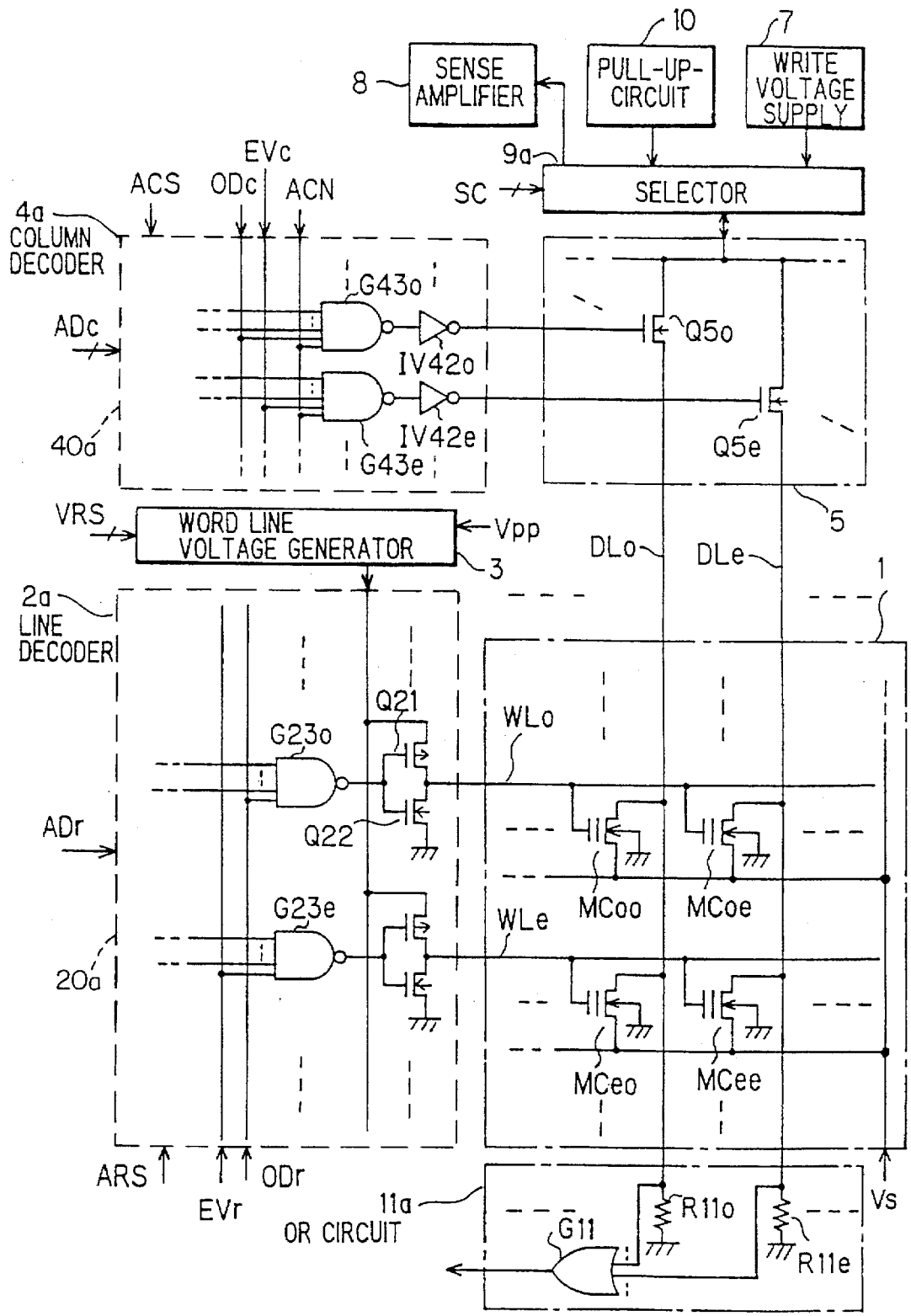
FIG. 4 shows a third embodiment of the invention.

FIG. 4 shows a third embodiment of the invention.

Differences of the third embodiment from the second embodiment of FIG. 3 lie in;

that the OR circuit 11 of FIG. 3 is replaced with an OR circuit 11a, wherein a pull-down resistor R11o, or R11e (suffixes 'o' and 'e' denoting an odd and an even number respectively, and the same in the following paragraphs) is connected between each input terminal of the OR gate G11 and the ground, resistance of the pull-down resistors R11o or R11e being sufficiently larger than that of the resistor R10 in the pull up circuit 10, that the line decoder 2 of FIG. 3 is replaced with a line decoder 2a, having a first even-odd selecting means 20a, wherein each NAND gate G23 corresponding to each of the word lines WL1 to WLm is replaced with a NAND gate G23o or G23e, both having one more input terminal added to the NAND gate G23 to be supplied with an odd number signal ODr or an even number signal EVr respectively, and that the column decoder 4 is replaced with a column decoder 4a, having a second even-odd selecting means 40a, wherein each NAND gate G43 provided in the column decoder 4 corresponding to each of the digit lines DL1 to DLn is replaced with a NAND gate G43e or G43e, both having one more input terminal added to the NAND gate G43 to be supplied with an odd number signal ODc or an even number signal EVc respectively.

In the third embodiment of FIG. 4, write and read time of the checkered pattern test data can be reduced.

To write a checkered pattern data in the embodiment, the control signals ARS and ACN being set at low level, all the word lines WL1 to WLm are selected and impressed by the positive first word line voltage, and all the digit lines DL1 to DLn being set floating, at un-selected state, the source line SL is impressed with the erase voltage Vs, for the first time, to make all the memory-cell-transistors MC11 to MCmn initialized by infusing hot carriers to their floating gates by way of the avalanche breakdown (writing all '0' data).

Next, the control signals ARS and ACS being set to low level, the control signal ACN being set to high level, the odd number signals ODr and ODc being set at low level, and the even number signals EVr and EVc being set at high level, to select all the even numbered lines (WLe and DLe) of the word lines WL1 to WLm and the digit lines DL1 to DLn, a write voltage is impressed between the selected word lines and digit lines to write '1' in all the memory-cell-transistors MCee. that are even numbered in both the word line and the column line.

Then, leaving the control signals as they are, the odd number signals ODr and ODc being shifted to high level, while the even number signals EVr and EVc shifted to low level in order to select all the odd numbered lines (WLo and DLo) of the word lines WL1 to WLm and the digit lines DL1 to DLn, the write voltage is impressed between the selected word lines and digit lines to write '1' in all the memory-cell-transistors MCoo that are odd numbered in both the word line and the column line.

As a result, checkered pattern data are obtained, because '1' is written in every of the memory-cell-transistors MCee and MCoo that are even or odd numbered in both the word line and the digit line, and '0' is written in every of the memory-cell-transistors MCeo and MCoe that are even and odd numbered in the word line and in the digit line.

Now, the readout of the checkered pattern data will be described.

As memory-cell-transistors written with '1' are in off-cell state, they can be checked as follows.

Every even line of the word lines WL1 to WLm and the digit lines DL1 to DLn is selected, for the first, in the same way as the data write of the checkered pattern. By impressing a voltage equal with or slightly higher than a voltage to be impressed in a ordinary readout process to the selected word lines, and connecting the selected digit lines to the sense amplifier 8, the sense amplifier 8 can verify total current level of all the memory-cell-transistors even numbered in both word and digit line, that is, in off-cell ('1' or marked) state.

Then, total current level of all the memory-cell-transistors odd numbered in both word and digit line also in off-cell ('1') state is verified similarly.

As for verification of memory-cell-transistors in '0' state, that is, on-cell state unable to be checked with OR logic, they should be checked one by one, if they are to be checked with the sense amplifier 8, since the sense amplifier 8 can check only one memory-cell-transistor connected to only one digit line.

Therefore, in order to verify collectively all of the memory-cell-transistors in '0' state connected to one word line, the pull-up circuit 10 and the OR circuit 11a are provided in the embodiment.

Each word line is selected one by one and impressed with a predetermined voltage, that is the same with or slightly lower than a voltage applied for normal readout, for example.

When an odd numbered word line is selected, the column selector 5 selects M1 the even numbered digit lines to be connected to the pull-up circuit 10 through the selector 9a, while all the odd numbered digit lines are selected and connected to the pull-up circuit 10 when an even numbered word line is selected.

As a result, when memory-cell-transistors connected to all the selected digit lines are in a normal '0' state (on-cell state), all of the input terminals of the OR gate 11 of the OR circuit 11a become at low, the ground level, including input terminals of the OR gate 11 connected to the un-selected digit lines grounded through the pull-down resistors (R11o, R11e).

When there is any memory-cell-transistor in the '1' (off-cell) state, corresponding digit line is pulled up by the pull-up circuit 10 through the resistor R10 having resistance lower than the pull-down resistors (R11o, R11e), resulting in a high level output of the OR gate G11.

Thus, the write and read time of the checkered pattern test data are both reduced in the embodiment.

By the way, in the above description, the '1' data are written in even columns of even lines for the first followed by '1' data in odd columns of odd lines and they are readout in the same order. But it is apparent that the processes may be performed inversely or in any other order, and that the checkered pattern test data may be composed with the '0' data in every even column of every even line and every odd column of every even line and '1' data in other cross points.

Further, it can be understood that the all '1' (off-cell) data can be also written easily in the embodiment and can be verified by the sense amplifier in a similar way and that the all '0' data can be verified also with the OR circuit 11a of the embodiment as well as the second embodiment beforehand described.

As heretofore described, in the second or the third embodiment of the present invention, the all '0' test data, the all '1' test data and the checkered pattern test data can be written collectively at once by selecting all the memory-cell-transistor, or selecting a combination of even or odd word lines and even or odd digit lines, and furthermore, even the verification of '0' data too can be performed collectively word by word, enabling a remarkable reduction of total time necessary for the memory check.

Thus, in a non-volatile semiconductor memory of the present invention, the initialization of all the memory-cell-transistors can be sufficiently performed with an erase pulse impression process followed by one depression discrimination process, the memory check including read-write of all '0' data, all '1' data and checkered pattern data can be performed in a reduced time, and no high voltage type transistors is required.

What is claimed is:

1. A non-volatile semiconductor memory comprising:

a memory cell array consisting of a matrix of memory-cell-transistors arranged in lines and columns, each of said memory-cell-transistors able to be marked and erased electrically;

word lines, each of said word lines connected to control gates of memory-cell-transistors arranged in each of said lines of said matrix;

digit lines, each of said digit lines connected to drains of memory-cell-transistors arranged in each of said columns of said matrix;

a source line connected to sources of all of said matrix of memory-cell-transistors;

a word line voltage generator for generating word line voltages including a first word line voltage used in an erase pulse impression process and a second word line voltage used in a depression discrimination process;

a line decoder for selecting and supplying all of said word lines with said first word line voltage in said erase pulse impression process and said second word line voltage in said depression discrimination process, and selecting and supplying one of said word lines designated by a line address signal delivered from outside with corresponding word line voltages generated by said word line voltage generator in an ordinary readout process and an ordinary data write process respectively;

a source voltage supply for supplying said source line with an erase pulse of a predetermined voltage in said erase pulse impression process, and otherwise grounding said source line;

a column decoder and a column selector for leaving all of said digit lines floating in said erase pulse impression process, selecting all of said digit lines in said depression discrimination process, and selecting one of said digit lines designated by a column address signal delivered from outside in an ordinary readout process and an ordinary data write process;

a sense amplifier for discriminating a signal level of said all of said digit lines selected in said depression discrimination process and said one of said digit lines selected in said ordinary readout process; and a write voltage supply for supplying said one of said digit lines selected with a predetermined voltage in said ordinary data write process.

2. A non-volatile semiconductor memory recited in claim 1, wherein:

each of said memory-cell-transistors consists of a n-channel type field effect transistor having a floating gate, and a substrate grounded;

all of said memory-cell-transistors are erased collectively by infusing hot carriers into said floating gates thereof by way of avalanche breakdown caused with said first word line voltage impressed to gates thereof and said erase pulse impressed to sources thereof in said erase pulse impression process; and any of said memory-cell-transistors in depression is detected collectively by discriminating a total current level flowing on all of said digit lines with said second word line voltage supplied to control gates thereof, by said sense amplifier connected to all of said digit lines selected by said column decoder and said column selector, in said depression discrimination process performed after said erase pulse impression process.

3. A non-volatile semiconductor memory recited in claim 1 provided with a memory control voltage supply for generating memory control voltages supplied to said word line voltage generator and said write voltage supply, comprising:

a first and a second resistor serially connected between a high voltage power supply and a ground terminal;

a first n-channel type transistor with a gate connected to a connection between said first and said second resistors and a source connected to one having higher voltage of said high voltage power supply and said ground terminal;

a second n-channel type transistor with a drain connected to a source of said first n-channel type transistor, a source connected to an output terminal for supplying said memory control voltages and a gate delivered with a first reference voltage; and a p-channel type transistor with a drain connected to the other one having lower voltage of said high voltage power supply and said ground terminal, a source connected to said output terminal and a gate delivered with a second reference voltage.

4. A non-volatile semiconductor memory recited in claim 1 provided with a memory control voltage supply for generating memory control voltages supplied to said word line voltage generator and said write voltage supply, comprising:

a first and a second resistor serially connected between a high voltage power supply and a ground terminal;

a first p-channel type transistor with a gate connected to a connection between said first and said second resistors and a drain connected to one having lower voltage of said high voltage power supply and said ground terminal;

an n-channel type transistor with a drain connected to the other one having a higher voltage of said high voltage power supply and said ground terminal, a source connected to an output terminal for supplying said memory control voltages therefrom and a gate delivered with a first reference voltage; and a second p-channel type transistor with a drain connected to a source of said first p-channel type transistor, a source connected to an output terminal and a gate delivered with a second reference voltage.

5. A non-volatile semiconductor memory recited in claim 1, further comprising:

a pull-up circuit for supplying all of said digit lines connected thereto and disconnected from said sense amplifier in an erase check process performed after said erase pulse impression process with a normal power supply voltage through a resistor having a resistance sufficiently higher than a resistance of said memory-cell-transistors in on-cell state; and an OR circuit for confirming on-cell states collectively of memory-cell-transistors connected to one of said word lines selected one after one to be supplied with a third word line voltage, by obtaining OR logic of signals of all of said digit lines connected thereto.

6. A non-volatile semiconductor memory recited in claim 1, wherein:

said line decoder comprises first even-odd selecting means for selecting either all even numbered or all odd numbered of said word lines;

said column decoder comprises second even-odd selecting means for selecting either all even numbered or all odd numbered of said digit lines;

an OR circuit is further provided for obtaining OR logic of signals of all of said digit lines;

a pull-up circuit is also provided for supplying digit lines selected by said column decoder to be connected thereto with a normal power supply voltage through a resistor having a resistance sufficiently higher than a resistance of said memory-cell-transistors in on-cell state;

checkered pattern test data are written by erasing one of every adjacent two in lines and columns of said memory-cell-transistors and marking the other of said every adjacent two by controlling said first and said second even-odd selecting means;

states of memory-cell-transistors marked of said checkered pattern test data are verified collectively with said sense amplifier by detecting a total current level floating on all of said digit lines connected thereto with a word line voltage impressed to all even numbered and all odd numbered of said word lines under control by said first even-odd selecting means; and states of memory-cell-transistors erased of each line of said checkered pattern test data are checked collectively each by each with said OR circuit obtaining OR logic signals of all of said digit lines, impressing a word line voltage to a word line corresponding to said each line, connecting said pull-up circuit to a half of said digit lines corresponding to memory-cell-transistors erased of said each line, and grounding the other half of said digit lines through resistance.

7. A non-volatile semiconductor memory recited in claim 6, wherein said OR circuit comprises:

pull-down resistors, each of said pull-down resistors provided between each of said digit lines and said ground terminal; and an OR gate for obtaining OR logic of signals of all of said digit lines.

8. A method of initialization and defect detection in a non-volatile semiconductor memory, comprising:

(a) generating an erase pulse impression process to initialize the non-volatile semiconductor memory, wherein the erase pulse impression process avoids causing depression;

(b) generating a depression discrimination process; and (c) determining when a defect is present in the no-volatile semiconductor memory from an output of the depression discrimination process;

wherein only one cycle of steps (a) and (b) are necessary for initialization and defect detection.

9. The method of initialization and defect detection in a non-volatile semiconductor memory according to claim 8, wherein the erase pulse impression process comprises:

impressing a positive first word line voltage to all control gates of memory-cell-transistors;

impressing an erase voltage to all sources of the memory-cell-transistors;

thereby causing avalanche breakdown in the memory-cell-transistors.

10. The method of initialization and defect detection in a non-volatile semiconductor memory according to claim 8, wherein the depression discrimination process comprises:

selecting all memory-cell-transistors;

detecting a total current level from all memory-cell-transistors; and discriminating a total current level from all memory-cell-transistors in order to detect when at least one memory-cell-transistor is in depression, thus identifying a defect.

11. The method of initialization and defect detection in a non-volatile semiconductor memory according to claim 8, wherein the method further comprises performing a "0" data test comprising:

connecting all digit lines to a pull-up circuit;

individually selecting word lines thereby shifting all digit lines to a LOW logic level;

ORing an output of all digit lines; and detecting a defect when a HIGH logic level results from the step of ORing the output.

* * * * *